(12) United States Patent
Hoegerl et al.

(10) Patent No.: US 10,964,642 B2
(45) Date of Patent: Mar. 30, 2021

(54) SEMICONDUCTOR MODULE COMPRISING TRANSISTOR CHIPS, DIODE CHIPS AND DRIVER CHIPS ARRANGED IN A COMMON PLANE

(71) Applicant: Infineon Technologies AG, Neubiberg (DE)

(72) Inventors: Juergen Hoegerl, Regensburg (DE); Andre Arens, Ruethen (DE); Holger Torwesten, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/877,749

(22) Filed: Jan. 23, 2018

(65) Prior Publication Data
US 2018/0211917 A1 Jul. 26, 2018

(30) Foreign Application Priority Data
Jan. 23, 2017 (DE) .................... 10 2017 101 185.4

(51) Int. Cl.
*H01L 23/29* (2006.01)
*H01L 23/34* (2006.01)
(Continued)

(52) U.S. Cl.
CPC ...... *H01L 23/5389* (2013.01); *H01L 21/4853* (2013.01); *H01L 21/565* (2013.01); *H01L 23/293* (2013.01); *H01L 23/3114* (2013.01); *H01L 23/3121* (2013.01); *H01L 23/34* (2013.01); *H01L 23/3735* (2013.01); *H01L 23/4334* (2013.01); *H01L 23/49861* (2013.01); *H01L 24/24* (2013.01); *H01L 24/25* (2013.01); *H01L 24/48* (2013.01); *H01L 24/82* (2013.01); *H01L 25/16* (2013.01); *H01L 23/49541* (2013.01); *H01L 23/49589* (2013.01);
(Continued)

(58) Field of Classification Search
CPC .............................. H01L 23/492; H01L 23/48
See application file for complete search history.

(56) References Cited

U.S. PATENT DOCUMENTS 8,120,158 B2    2/2012  Ewe et al.
8,604,610 B1 *  12/2013 Hughes ............... H01L 23/4334
                                                    257/675
(Continued)

FOREIGN PATENT DOCUMENTS

CN       103534801       1/2014
CN       105006453      10/2015
(Continued)

*Primary Examiner* — Omar F Mojaddedi
(74) *Attorney, Agent, or Firm* — Dicke, Billig & Czaja, PLLC

(57) ABSTRACT

A semiconductor module is disclosed. In one example, the module includes a carrier, at least one semiconductor transistor disposed on the carrier, at least one semiconductor diode disposed on the carrier, at least one semiconductor driver chip disposed on the carrier, a plurality of external connectors, and an encapsulation layer covering the carrier, the semiconductor transistor, the semiconductor diode, and the semiconductor driver chip. The semiconductor transistor, the semiconductor diode, and the semiconductor driver chip are arranged laterally side by side on the carrier.

4 Claims, 7 Drawing Sheets

(51) Int. Cl.
*H01L 23/498* (2006.01)
*H01L 23/373* (2006.01)
*H01L 25/16* (2006.01)
*H01L 23/48* (2006.01)
*H01L 23/31* (2006.01)
*H01L 23/538* (2006.01)
*H01L 23/00* (2006.01)
*H01L 21/48* (2006.01)
*H01L 21/56* (2006.01)
*H01L 23/433* (2006.01)
*H01L 23/495* (2006.01)
*H01L 23/50* (2006.01)

(52) U.S. Cl.
CPC .............. *H01L 23/50* (2013.01); *H01L 24/49* (2013.01); *H01L 2224/24137* (2013.01); *H01L 2224/24225* (2013.01); *H01L 2224/48091* (2013.01); *H01L 2224/48227* (2013.01); *H01L 2224/49171* (2013.01); *H01L 2924/00014* (2013.01); *H01L 2924/10272* (2013.01); *H01L 2924/1203* (2013.01); *H01L 2924/13055* (2013.01); *H01L 2924/13091* (2013.01); *H01L 2924/1426* (2013.01); *H01L 2924/14251* (2013.01); *H01L 2924/14252* (2013.01); *H01L 2924/19105* (2013.01)

(56) References Cited

U.S. PATENT DOCUMENTS

| | | | |
|---|---|---|---|
| 8,866,302 B2 | 10/2014 | Ewe et al. | |
| 9,064,869 B2 | 6/2015 | Hoegerl et al. | |
| 9,196,510 B2 | 11/2015 | Hohlfeld et al. | |
| 9,287,231 B2 | 3/2016 | Chen | |
| 9,666,512 B2 | 5/2017 | Im et al. | |
| 9,806,029 B2 | 10/2017 | Otremba et al. | |
| 2011/0108971 A1* | 5/2011 | Ewe | H01L 21/56 257/686 |
| 2011/0204500 A1* | 8/2011 | Lim | H01L 23/38 257/675 |
| 2012/0306086 A1 | 12/2012 | Sugimura et al. | |
| 2013/0256856 A1* | 10/2013 | Mahler | H01L 23/49833 257/676 |
| 2015/0092376 A1 | 4/2015 | Arens et al. | |
| 2015/0130048 A1 | 5/2015 | Hohlfeld et al. | |
| 2015/0173248 A1* | 6/2015 | Zeng | H05K 7/1432 361/709 |
| 2015/0245478 A1* | 8/2015 | Miyazawa | H05K 3/4007 174/257 |
| 2015/0303164 A1* | 10/2015 | Chen | H01L 24/32 361/720 |
| 2015/0340350 A1* | 11/2015 | Koga | H01L 23/49551 257/713 |
| 2016/0099207 A1 | 4/2016 | Fuergut et al. | |
| 2016/0126192 A1 | 5/2016 | Hohlfeld et al. | |
| 2016/0352246 A1* | 12/2016 | Lai | H01L 24/20 |

FOREIGN PATENT DOCUMENTS

| | | |
|---|---|---|
| CN | 105655314 | 6/2016 |
| DE | 10 2012 100 243 A1 | 7/2012 |
| DE | 10 2010 038 154 A1 | 4/2015 |
| DE | 10 2014 113 787 A1 | 4/2015 |

* cited by examiner

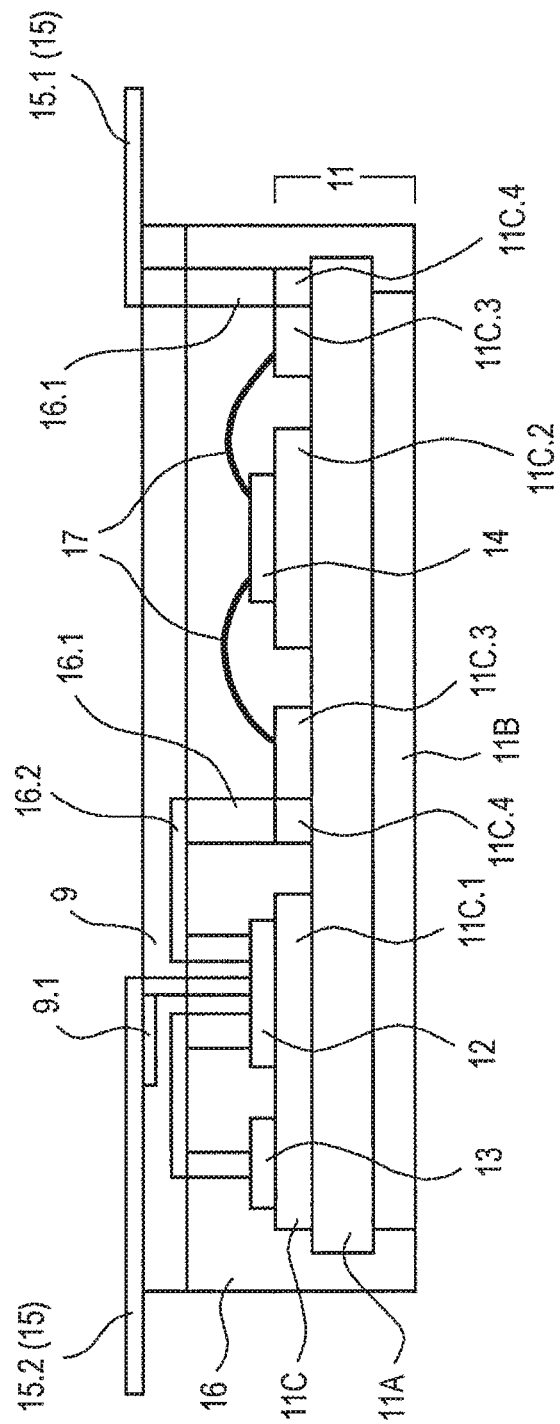

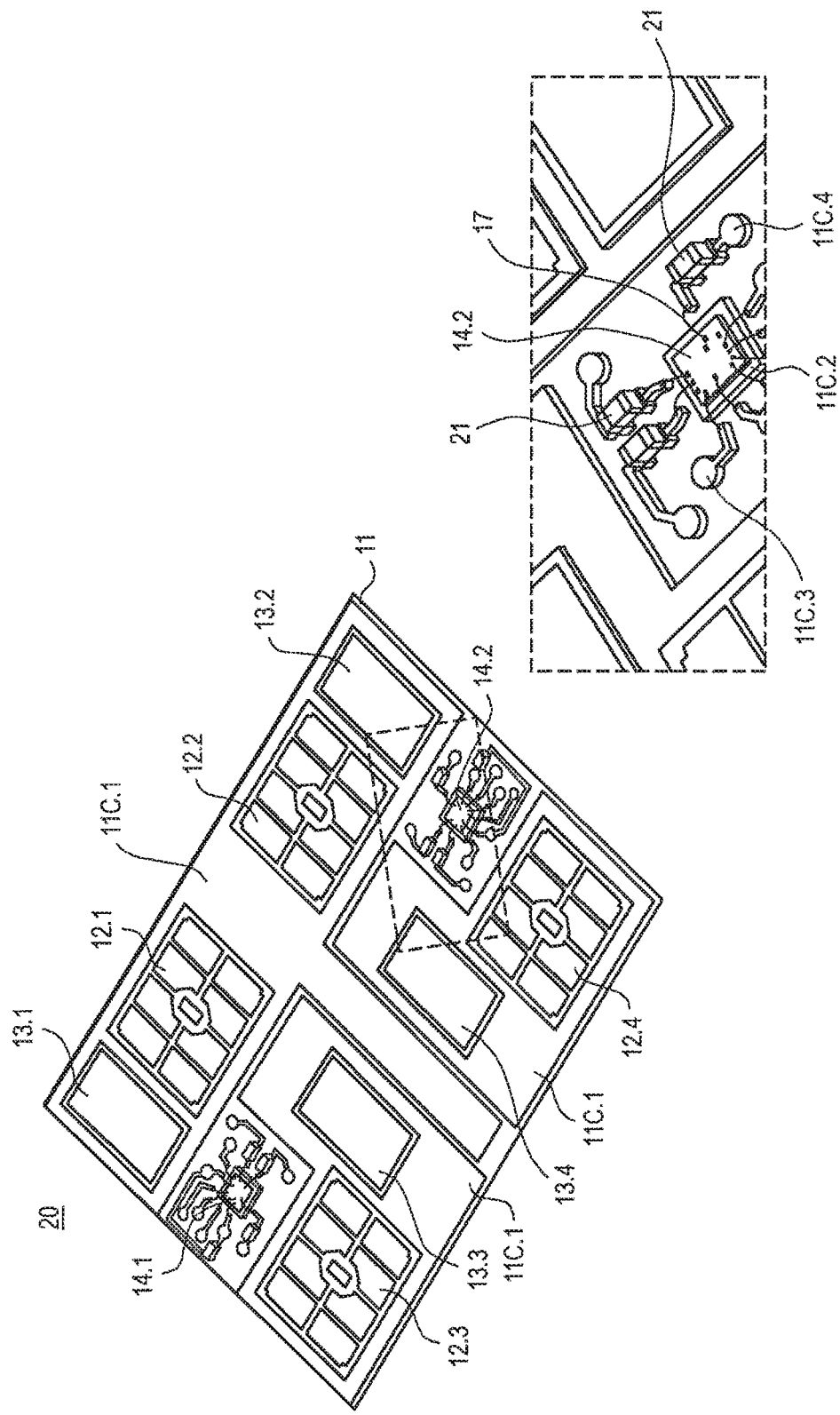

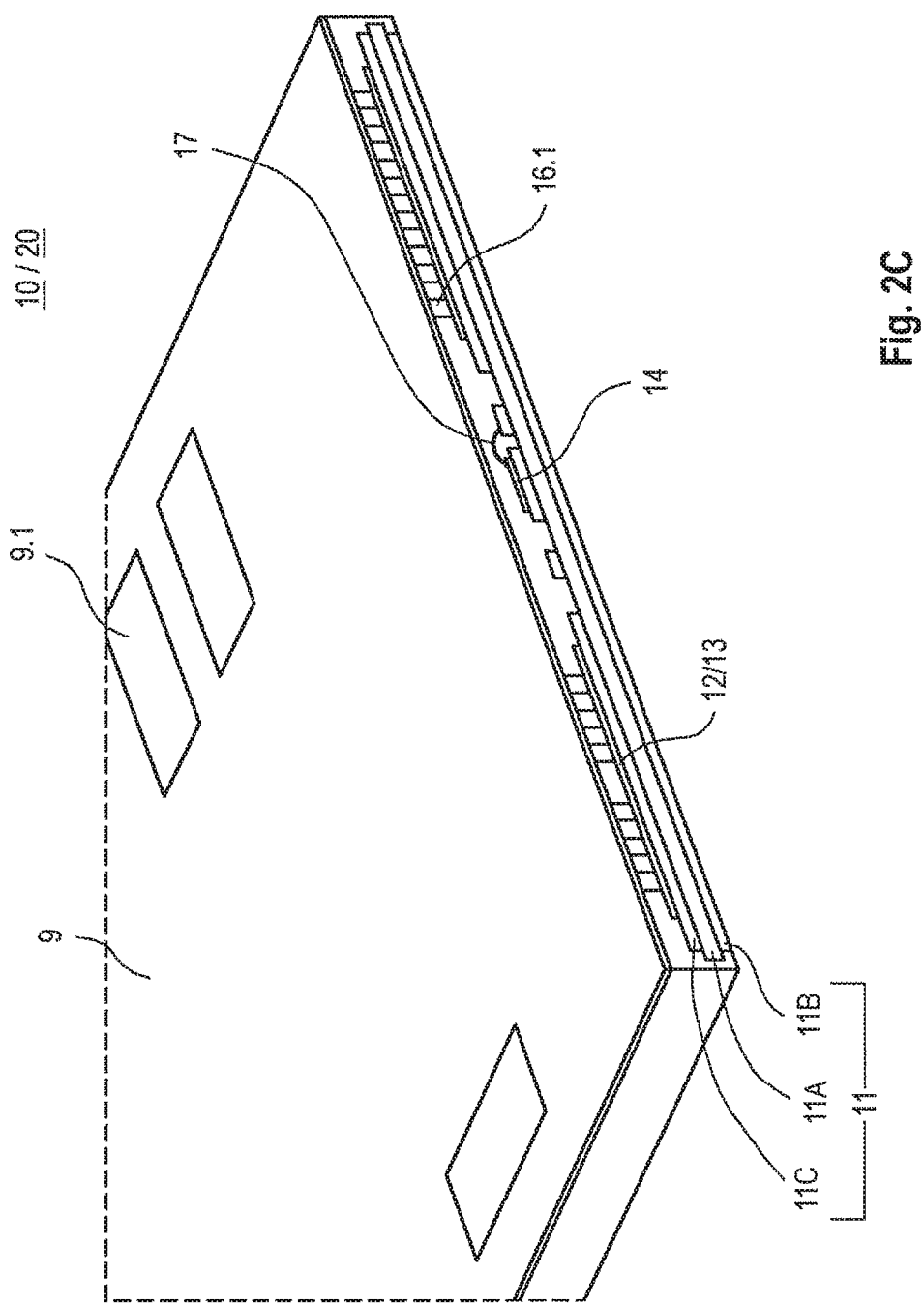

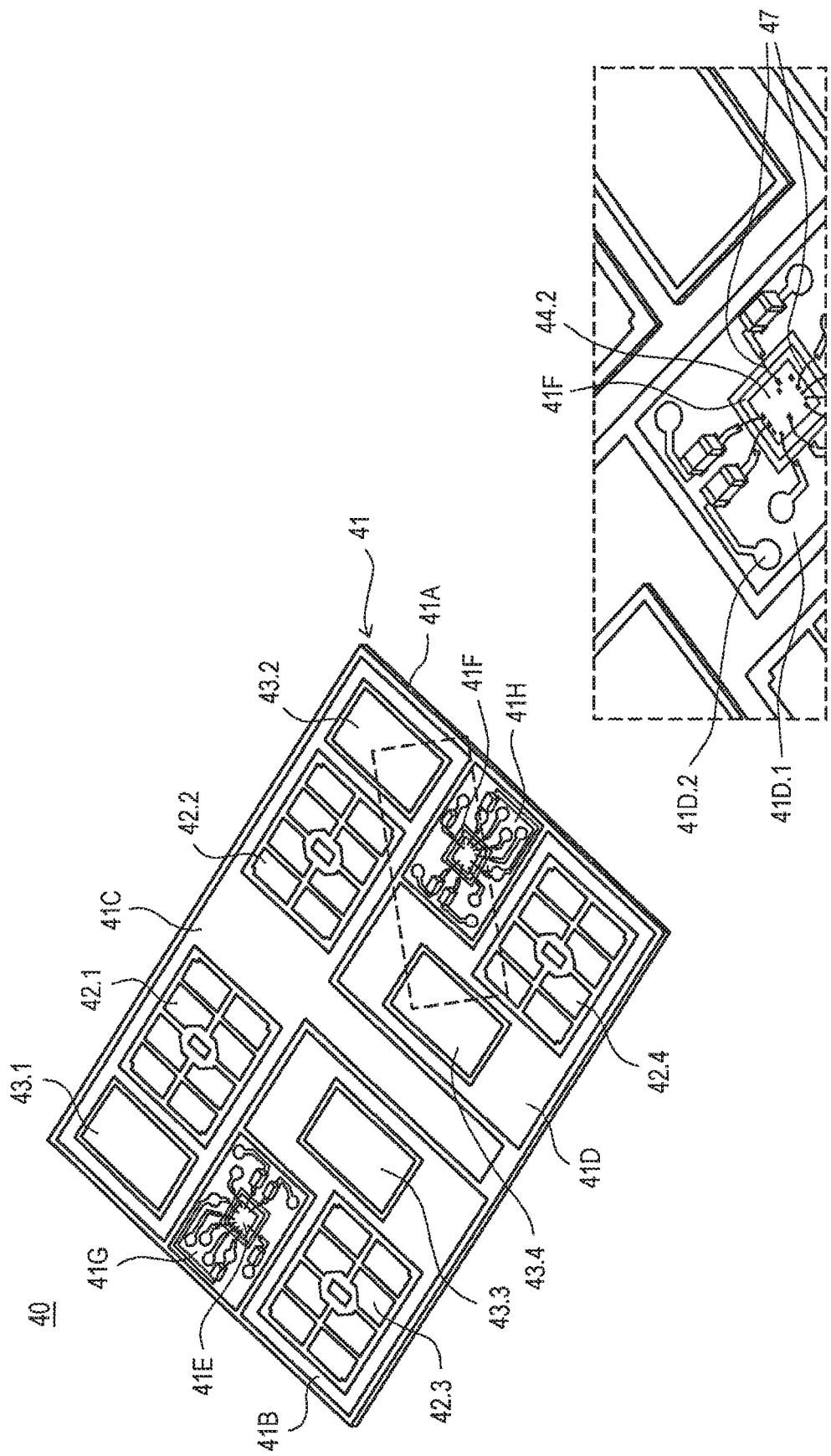

US 10,964,642 B2

SEMICONDUCTOR MODULE COMPRISING TRANSISTOR CHIPS, DIODE CHIPS AND DRIVER CHIPS ARRANGED IN A COMMON PLANE

CROSS-REFERENCE TO RELATED APPLICATION

This Utility Patent Application claims priority to German Patent Application No. 10 2017 101 185.4, filed Jan. 23, 2017, which is incorporated herein by reference.

TECHNICAL FIELD

The present disclosure relates to a semiconductor module, an integrated power module, and a method for fabricating a semiconductor module.

BACKGROUND

In many electronic systems it is necessary to employ voltage or current converters like AC/AC converters, AC/DC converters, DC/AC converters, DC/DC converters, or frequency converters in order to generate the currents, voltages and/or frequencies to be used by an electronic circuit like, for example, a motor driving circuit. The converter circuits as mentioned before typically comprise one or more half-bridge circuits, each provided by two semiconductor power switches, such as e.g. power MOSFET devices, in particular insulated gate bipolar transistor (IGBT) devices, and further components such as diodes connected in parallel to the transistor devices, and passive devices such as resistors, inductors, and capacitors. The switching of the power MOSFET devices can be controlled by one or more semiconductor driver devices. The assembly of the aforementioned devices can in principle be accomplished by mounting and interconnecting the devices as individual components on a printed circuit board (PCB). There is, however, a general tendency to provide integrated semiconductor modules having short interconnections between the devices in order to reduce switching losses and parasitic inductances. A further aspect to be observed is an efficient heat dissipation of the devices.

SUMMARY

In accordance with a first aspect of the disclosure a semiconductor module comprises a carrier, at least one semiconductor transistor disposed above the carrier, at least one semiconductor diode disposed above the carrier, at least one semiconductor driver chip disposed above the carrier, a plurality of external connectors, and an encapsulation layer covering the carrier, the semiconductor transistor, the semiconductor diode, and the semiconductor driver chip, the encapsulation layer comprising electrical via connections for providing electrical connections between the at least one semiconductor driver chip and the external connectors, between the at least one semiconductor driver chip and the at least one semiconductor transistor, and between the at least one semiconductor transistor and the at least one semiconductor diode.

In accordance with a second aspect of the disclosure an integrated power module comprises a carrier, at least one power transistor disposed above the carrier, at least one power diode disposed above the carrier, at least one driver chip disposed above the carrier, a plurality of external connectors, and an encapsulation layer covering the power transistor and the power diode, the encapsulation layer comprising electrical via connections for providing electrical connections between the driver chip and the external connectors.

In accordance with a third aspect of the disclosure a method for fabricating a semiconductor module comprises providing a carrier, the carrier comprising an uppermost metallic layer and an insulating layer underneath the metallic layer, the metallic layer comprising at least one metallic portion and at least one opening portion in which the insulating layer is exposed, disposing at least one semiconductor transistor and at least one semiconductor diode on metallic portions of the metallic layer, disposing at least one semiconductor driver chip on the insulating layer in an opening portion of the metallic layer, applying an encapsulation layer onto the carrier, the semiconductor transistor, the semiconductor diode, and the semiconductor driver chip, forming electrical via connections into the encapsulation layer, applying a plurality of external connectors, and forming electrical connections between the semiconductor driver chip and the external connectors, between the at least one semiconductor driver chip and the at least one semiconductor transistor, and between the at least one semiconductor transistor and the at least one semiconductor diode.

The person skilled in the art recognizes additional features and advantages upon reading the following detailed description and upon giving consideration to the accompanying drawings.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

FIG. 1 shows a schematic cross-sectional side view representation of a semiconductor module according to an example in which a direct bonded copper (DCB) substrate is used as a carrier.

FIG. 2 comprises FIG. 2A to 2C and shows schematic perspective view representations of a semiconductor module according to an example in which a DCB substrate is used as a carrier and the module comprises two switching units each one comprising two transistor chips and two diode chips and one driver chip.

DETAILED DESCRIPTION

Figure 3:
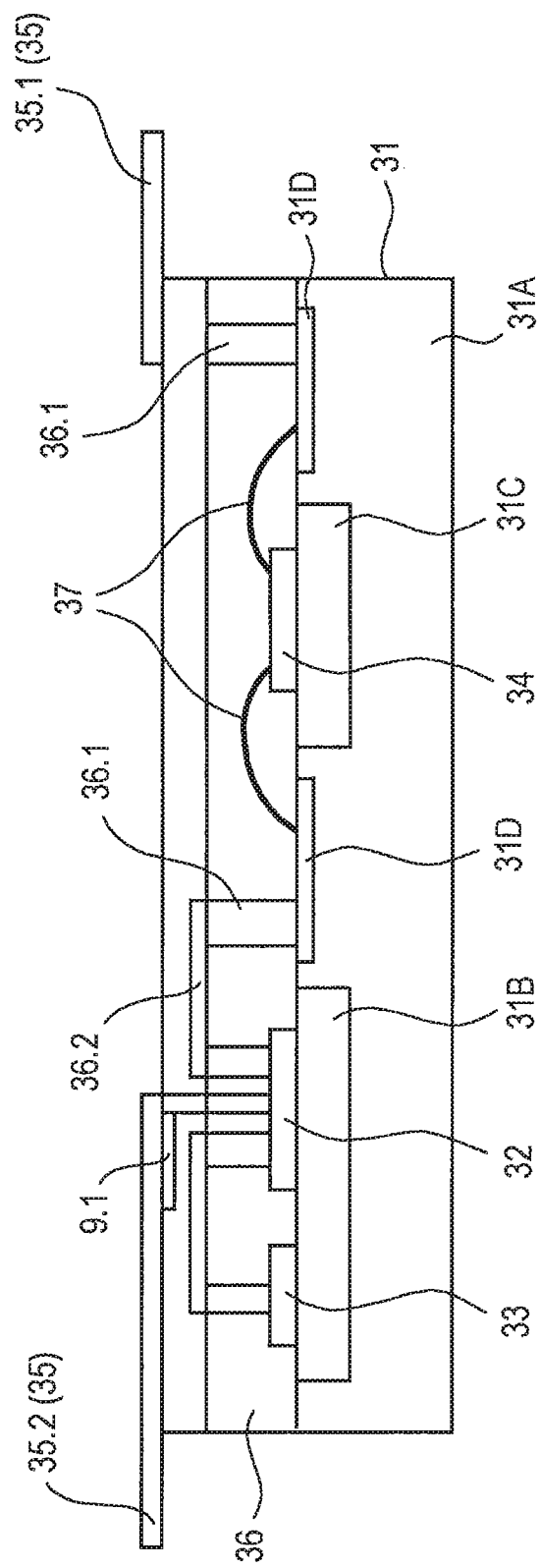
FIG. 3 shows a schematic cross-sectional side view representation of a semiconductor module according to an example in which a mold embedded leadframe is used as a carrier.

The aspects and examples are now described with reference to the drawings, wherein like reference numerals are generally utilized to refer to like elements throughout. In the following description, for purposes of explanation, numerous specific details are set forth in order to provide a thorough understanding of one or more aspects of the examples. It may be evident, however, to one skilled in the art that one or more aspects of the examples may be practiced with a lesser degree of the specific details. In other instances, known structures and elements are shown in schematic form in order to facilitate describing one or more aspects of the examples. It is to be understood that other examples may be utilized and structural or logical changes may be made without departing from the scope of the present disclosure. It should be noted further that the drawings are not to scale or not necessarily to scale.

In the following detailed description, reference is made to the accompanying drawings, which form a part hereof, and in which is shown by way of illustration specific aspects in which the disclosure may be practiced. In this regard, directional terminology, such as "top", "bottom", "front", "back" etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present disclosure is defined by the appended claims.

The examples of a semiconductor module, an integrated power module, and a method for fabricating a semiconductor module may use various types of transistor devices. The examples may use transistor devices embodied in semiconductor dies or semiconductor chips wherein the semiconductor dies or semiconductor chips may be provided in a form of a block of semiconducting material as fabricated from a semiconductor wafer and diced out from the semiconductor wafer, or in another form in which further process steps have been carried out like, for example, applying an encapsulation layer to the semiconductor die or semiconductor chip. The examples may also use horizontal or vertical transistor devices wherein those structures may be provided in a form in which all contact elements of the transistor device are provided on one of the main faces of the semiconductor die (horizontal transistor structures) or in a form in which at least one electrical contact element is arranged on a first main face of the semiconductor die and at least one other electrical contact element is arranged on a second main face opposite to the main face of the semiconductor die (vertical transistor structures) like, for example, MOS transistor structures or IGBT (Insulated Gate Bipolar Transistor) structures. Insofar as the transistor chips are configured as power transistor chips, the examples of a semiconductor package disclosed further below can be classified as intelligent power modules (IPM).

In any case the semiconductor dies or semiconductor chips may comprise contact elements or contact pads on one or more of their outer surfaces wherein the contact elements serve for electrically contacting the semiconductor dies. The contact elements may have any desired form or shape. They can, for example, have the form of lands, i.e. flat contact layers on an outer surface of the semiconductor die. The contact elements or contact pads may be made from any electrically conducting material, e.g. from a metal as aluminum, gold, or copper, for example, or a metal alloy, or an electrically conducting organic material, or an electrically conducting semiconductor material. The contact elements may also be formed as layer stacks of one or more of the above-mentioned materials.

The examples of a semiconductor module, an integrated power module, and a method for fabricating a semiconductor module may comprise an encapsulant or encapsulation layer having the semiconductor transistor chip, the semiconductor diode chip, and the semiconductor driver chip embedded therein. The encapsulant or encapsulation layer can be any electrically insulating material like, for example, any kind of molding material, any kind of resin material, or any kind of epoxy material, a bismaleimide, or a cyanate ester. The encapsulant or encapsulation layer also be a polymer material, a polyimide material, or a thermoplast material. The first and second mold compounds may also comprise any of the above-mentioned materials and further include filler materials embedded therein like, for example, thermally conductive increments. These filler increments can be made of SiO, SiC, Al2O3, ZnO, AlN, BN, MgO, Si3N4, or ceramic, or a metallic material like, for example, Cu, Al, Ag, or Mo. Furthermore the filler increments may have the shape of fibers and can be made of carbon fibers or nanotubes, for example. The encapsulant or encapsulation layer may also include further additives for adjusting manufacturing properties.

Insofar as a method for producing a semiconductor module is described as having a specific order of method steps, it should be mentioned that any other appropriate order of the method steps may be employed by the skilled person. It should further be mentioned that any comments, remarks or features mentioned in connection with a described method are to be understood as also disclosing a device being obtained or resulting from such comments, remarks or features, even if such a device is not explicitly described or illustrated in the figures. Furthermore any comments, remarks or features mentioned in connection with a device are to be understood as also disclosing a method step for providing or fabricating the respective device feature.

FIG. 1 shows a schematic cross-sectional side view representation of an exemplary semiconductor module according to the first aspect. The semiconductor module 10 of FIG. 1 comprises a carrier 11, a semiconductor transistor chip 12 disposed on or above the carrier 11, a semiconductor diode chip 13 disposed on or above the carrier 11, and a semiconductor driver chip 14 disposed on or above the carrier 11. The semiconductor module 10 further comprises a plurality of external connectors 15, and an encapsulation layer 16 covering the carrier 11, the semiconductor transistor chip 12, the semiconductor diode chip 13 and the semiconductor driver chip 14, wherein the encapsulation layer 16 comprises electrical via connections 16.1 for providing electrical connections between the semiconductor driver chip 14 and the external connectors 15, between the semiconductor driver chip 14 and the semiconductor transistor chip 12, and between the semiconductor transistor chip 12 and the semiconductor diode chip 13. There can be provided electrical traces 16.2 on top of the encapsulation layer 16 forming connections between individual electrical via connections 16.1.

One specific feature of the semiconductor module 10 of the first aspect is that no one of the semiconductor transistor chip 12, the semiconductor diode chip 13 and the semiconductor driver chip 14 is disposed on or above the encapsulation layer 16 and rather all of the semiconductor chips are disposed in virtually one and the same common plane on the carrier 11 so that all of them benefit from an efficient heat dissipation through the carrier 11.

According to an example of the semiconductor module of the first aspect, the semiconductor transistor chip 12 and the semiconductor diode chip 13 are separate chips as shown in the example of FIG. 1. Alternatively the semiconductor transistor and the semiconductor diode can also be integrated on a common semiconductor chip which can be, for example, a silicon carbide (SiC) chip.

According to an example of the semiconductor module of the first aspect, the semiconductor diode is formed on a semiconductor diode chip which is an SiC chip.

According to an example of the semiconductor module of the first aspect, the external connectors 15 comprise first external connectors 15.1 and second external connectors 15.2. The first external connectors 15.1 are electrically connected to the semiconductor driver chip 14 by electrical via connections 16.1 of the encapsulation layer 16, and the second external connectors 15.2 are electrically connected with the semiconductor transistor chip 12, in particular with an electrode terminal like, for example, an emitter (source) or a collector (drain) terminal of the semiconductor transistor chip 12.

According to an example of the semiconductor module 10 of the first aspect, the electrical via connections 16.1 of the encapsulation layer 16 comprise lateral diameters greater than 50 μm, in particular greater than 100 μm, in particular greater than 150 μm, in particular greater than 200 μm. According to an example of the semiconductor module 10 of the first aspect, the electrical via connections 16.1 are fabricated by laser ablation.

According to an example of the semiconductor module 10 of the first aspect, the carrier 11 may comprise a substrate 11A comprising an insulating, dielectric or ceramic layer or tile, and a first metallic layer 11B on a lower surface of the substrate 11A and a second metallic layer 11C on an upper surface of the substrate 11A. According to an example the carrier 11 may comprise one or more of a direct copper bonded (DCB) substrate, a direct aluminum bonded (DAB) substrate, and an active metal brazing substrate, wherein the substrate may comprise a ceramic layer, in particular one or more of AlO, AlN, $Al_2O_3$, or a dielectric layer, in particular $Si_3N_4$. According to an example, the carrier 11 may comprise a first upper surface, a second lower surface opposite to the first upper surface, and side faces connecting the first and second surfaces, wherein the encapsulation layer 16 may cover the first upper surface and the side faces of the carrier 11. According to an example, the carrier 11 may comprise a substrate 11A which may be an inorganic or an organic substrate. The core of the substrate 11A, in particular of the organic substrate, may comprise a thermal conductivity better or higher than 1 W/mK. According to an example, the carrier 11 may comprise a thickness in a range from 0.1 mm to 0.3 mm, in particular in a range from 0.15 mm to 0.25 mm.

According to an example of the semiconductor module 10 of the first aspect, the carrier 11 comprises an uppermost metallic layer such as that denoted with reference sign 11C, and an insulating layer such as that denoted with reference sign 11A, underneath the metallic layer 11C, wherein the metallic layer 11C comprises at least a first metallic portion 11C.1 and at least a second metallic portion 11C.2. According to a further example thereof, the semiconductor transistor chip 12 and the semiconductor diode chip 13 are disposed on the first metallic portion 11C.1 and the semiconductor driver chip 14 is disposed on the second metallic portion 11C.2.

According to an example of the semiconductor module 10 of the first aspect, electrode terminals of the semiconductor transistor chip 12 and the semiconductor diode chip 13 are comprised in the form of contact pads of relatively large areas whereas electrical terminals of the semiconductor driver chip 14 are comprised of contact pads with relatively small areas, in particular areas which are considerably smaller than the areas of the contact pads of the semiconductor transistor chip 12 and the semiconductor diode chip 13. As a consequence thereof, the contact pads of the semiconductor transistor chip 12 and the semiconductor diode chip 13 can be connected directly to respective electrical via connections 16.1 of the encapsulation layer 16, whereas contact pads of the semiconductor driver chip 14 cannot be connected directly to the electrical via connections 16.1. The contact pads of the semiconductor driver chip 14 are instead connected to so-called foot points 11C.4 which themselves are connected directly with electrical via connections 16.1. The contact pads of the semiconductor driver chip 14 are connected by wire bonds to metallic lines 11C.3 and the metallic lines 11C.3 are connected at one of their ends to the foot points 11C.4. Such an arrangement can at best be seen in FIG. 2.

FIG. 2 comprises FIG. 2A to 2C and shows different perspective views on a semiconductor module 20 according to the first aspect. FIG. 2B is an enlarged view of the section within the rectangle framed by a black line in FIG. 2A.

According to an example of the semiconductor module 10 of the first aspect, as indicated before, the semiconductor module 10 further comprises a plurality of metallic foot points 11C.4, wherein each one of the foot points 11C.4 is disposed besides the semiconductor driver chip 14 and below one of the electrical via connections 16.1 of the encapsulation layer 16, wherein the semiconductor driver chip 14 comprises a plurality of contact pads, wherein each one of the plurality of foot points 11C.4 is connected with one of the plurality of contact pads. According to a further example thereof, the semiconductor module 10 further comprises a plurality of metallic lines 11C.3, wherein one or more of the foot points 11C.4 are connected with one end of one of the metallic lines 11C.3 wherein the other end of the one metallic line 11C.3 is connected to one of the contact pads of the semiconductor driver chip 14 by a bond wire 17.

According to a further example, one or more of the foot points 11C.3 comprise a diameter in a range from 300 µm to 1.2 mm, in particular from 500 µm to 1.0 mm. According to an example of the semiconductor module 20 of FIG. 2, the semiconductor module 20 comprises a circuit comprising four transistor chips 12.1, 12.2, 12.3 and 12.4 each one of which is connected in parallel to one of six diode chips 13.1, 13.2, 13.3 and 13.4. The circuit may be further divided in two half-bridge circuits, wherein a first half-bridge circuit is formed by a series connection of the transistors 12.1 and 12.3 providing a first signal at a node between the transistors 12.1 and 12.3, and a second half-bridge circuit is formed by a series connection of the transistors 12.2 and 12.4 providing a second signal at a node between the transistors 12.2 and 12.4. The transistors 12.1 and 12.2 are acting as the high side transistors of the half-bridge circuits, and the transistors 12.3 and 12.4 are acting as the low side transistors of the half-bridge circuits. The semiconductor transistor chips 12.1 to 12.4 can be formed by insulated gate bipolar transistor (IGBT) chips.

According to an example of the semiconductor module 20 of the first aspect, the semiconductor module 20 comprises a carrier 11 wherein the carrier 11 comprises an uppermost metallic layer 11C and an insulating layer 11A underneath the metallic layer 11C, wherein the metallic layer 11C comprises two opening portions in which the insulating layer 11A is exposed and on which two semiconductor driver chips 14.1 and 14.2 are disposed. The metallic layer 11C further comprises large area metallic portions 11C.1 on which the semiconductor transistor chips 12.1 to 12.4 and the semiconductor diode chips 13.1 to 13.4 are disposed. The metallic layer 11C further comprises small area metallic portions 11C.2 on which the semiconductor driver chips 14.1 and 14.2 are mounted, the metallic lines 11C.3 and the foot points 11C.4.

According to an example of the semiconductor modules 10 or 20 of the first aspect, the metallic layer 11C is fabricated by first providing a carrier like a DCB comprising a complete uppermost metallic layer and then removing by, for example, etching away specific portions so that the remaining portions are formed by the large areas 11C.1 for mounting the semiconductor transistor chips 12 and the semiconductor diode chips 13, the small areas 11C.2, the metallic lines 11C.3 and the foot points 11C.4.

According to an example of the semiconductor modules 10 or 20 of the first aspect, the semiconductor modules 10 or 20 may further comprise a plurality of passive electric devices (not shown in FIG. 1) disposed above or below the encapsulation layer 16. These passive electric devices can, for example, be resistors like shunt resistors, inductors, capacitors, diodes like Zener diodes, or sensors. As shown in FIGS. 2A and 2B passive electric devices 21 are inserted between portions of the metallic lines 11C.3. In this case, if afterwards the encapsulation layer 16 is applied, the passive electric devices 21 are disposed below the encapsulation layer 16. There might be other cases in which, for example, the passive electric devices 21 are found to be too voluminous to be connected with the metallic lines 11C.3 so that it is found to be better to dispose them above the encapsulation layer 16 and to connect them with the electrical via connections 16.1.

According to an example of the semiconductor modules 10 or 20 of the first aspect, the encapsulation layer 16 comprises one or more of a polymer material, a mold material, a resin material, an epoxy resin material, and acrylate material, a polyimide material, and a silicon-based material.

According to an example of the semiconductor modules 10 or 20 of the first aspect, a solder resist layer 9 is applied onto the encapsulation layer 16. The solder resist layer 9 comprises via connections connected with selected ones of the electrical via connections 16.1 of the encapsulation layer 16 and with solder pads 9.1 formed on the upper surface of the solder resist layer 9. The solder pads 9.1 can be used to connect the external connectors 15 thereto.

According to an example of the semiconductor modules 10 or 20 of the first aspect, the are via connections 16.1 shown in FIG. 1 and FIG. 2 are connected with the emitter of the semiconductor transistor chips 12 or 12.1 to 12.4, respectively. There are also other via connections which are not shown in FIG. 1 and FIG. 2 and which are connected with the upper layer 11A of the DCB 11 and in this way with the collector of the semiconductor chips 12 or 12.1 to 12.4, respectively. In this way a high-side/low-side connection can be realized between two IGBT chips wherein the redistribution plane on the encapsulation layer 16 is the plane in which the electrical connections are provided.

According to an example of the semiconductor modules 10 or 20 of the first aspect, the semiconductor driver chip 14 can be a bare semiconductor chip or semiconductor die such as indicated in FIG. 1 or FIG. 2. However, alternatively the semiconductor driver chip can also be provided in the form of a packaged device which could be embedded in the encapsulation layer 16, e.g. by soldering onto conducting traces which could be connected with the electrical via connections 16.1.

FIG. 3 shows another example of a semiconductor module according to the first aspect.

The semiconductor module 30 of FIG. 3 comprises a carrier 31, a semiconductor transistor chip 32 disposed on the carrier 31, a semiconductor diode chip 33 disposed on the carrier 31, a semiconductor driver chip 34 disposed on the carrier 31, a plurality of external connectors 35, and an encapsulation layer 36 covering the carrier 31, the semiconductor transistor chip 32, the semiconductor diode chip 33, and the semiconductor driver chip 34, the encapsulation layer 36 comprising electrical via connections 36.1 for providing electrical connections between the semiconductor driver chip 34 and the external connectors 35, between the semiconductor driver chip 34 and the semiconductor transistor chip 32, and between the at least one semiconductor transistor chip 32 and the semiconductor diode chip 33. There can be provided electrical traces 36.2 on top of the encapsulation layer 36 forming connections between individual electrical via connections 36.1.

In the example of a semiconductor module 30 of FIG. 3, the carrier 31 comprises a mold embedded leadframe comprising a mold layer 31A, leadframe portions 31B and 31C, and a printed circuit board (PCB) 31D. The leadframe portions 31B and 31C are embedded in recess areas of the mold layer 31A and also the PCB 31D is embedded in recess areas of the mold layer 31A. The PCB 31D is formed such that it surrounds the leadframe portion 31C. Furthermore the PCB 31D comprises metallic lines and foot points to connect the semiconductor driver chip 34 to the external connectors 35 and to the semiconductor transistor chip 32. Further details of the semiconductor module 30 will be shown and explained in connection with FIG. 4.

Figure 4C:
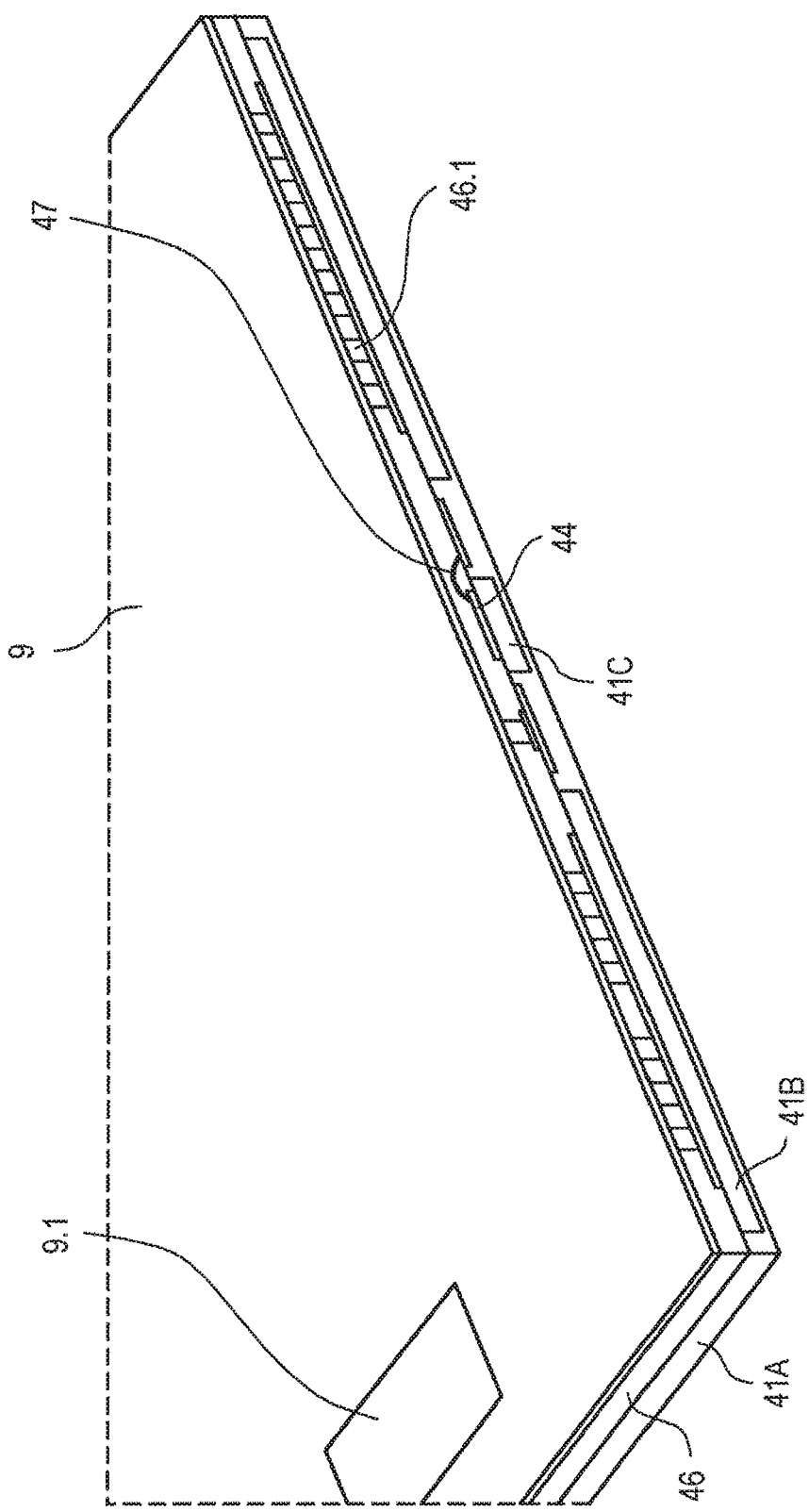
FIG. 4 comprises FIG. 4A to 4C and shows schematic perspective view representations of a semiconductor module according to an example in which a mold embedded leadframe is used as a carrier and the module comprises two switching units each one comprising two transistor chips, two diode chips and one driver chip.

FIG. 4 comprises FIG. 4A to 4C and shows a semiconductor module 40 which is similar to the semiconductor module 20 of FIG. 2 as concerns the semiconductor chips and their interconnectivity. FIG. 4B is an enlarged view of the rectangle within the area framed by a black line in FIG. 4A.

With respect to the structure, however, the semiconductor module 40 is constructed like the semiconductor module 30 of FIG. 3. Accordingly the semiconductor module 40 comprises a carrier 41 comprising a mold layer 41A, leadframe portions 41B, 41C, 41D, 41E and 41F and printed circuit boards (PCBs) 41G and 41H. The leadframe portions 41E and 41F are functioning as chip pads for the two semiconductor driver chips 44. The two PCBs 41G and 41H are formed so as to surround the leadframe portions 41E and 41F as described and explained in connection with FIG. 3. According to an example of the semiconductor module 40 of FIG. 4, the semiconductor module 40 comprises a circuit comprising four transistor chips 42.1, 42.2, 42.3 and 42.4 each one of which is connected in parallel to one of six diode chips 43.1, 43.2, 43.3 and 43.4. The interconnections between the semiconductor chips are the same as with the semiconductor chips of the semiconductor module 20 of FIG. 2.

The semiconductor transistor chips 42.1 and 42.2 and the semiconductor diode chips 43.1 and 43.2 are arranged on the leadframe portion 41C, the semiconductor transistor chip 42.3 and the semiconductor diode chip 43.4 are arranged on the leadframe portion 41B, and the semiconductor transistor chip 42.4 and the semiconductor diode chip 43.3 are arranged on the leadframe portion 41D.

As can be seen in the enlarged view of FIG. 4B, the PCB 41H comprises metallic lines 41D.1 and foot points 41D.2, wherein the contact pads of the semiconductor driver chip 44.2 are connected by bond wires 47 to one end of one of the metallic lines 41D.1 respectively, wherein the other end of the metallic line 41D.1 is connected to one of the foot points 41D.2. The foot points 41D.2 are then connected to the electrical via connections as denoted with reference sign 36.1 in FIG. 3.

Reference sign 46 shown in FIG. 4C denotes the encapsulation layer 46 corresponding to the encapsulation layer 36 shown in FIG. 3 and likewise reference sign 46.1 denotes the via connections 46.1 formed in the encapsulation layer 46 corresponding to the via connections 36.1 shown in FIG. 3 and likewise reference sign 47 denotes the bond wires 47 corresponding to the bond wires 37 shown in FIG. 3.

Further examples of the semiconductor module of the first aspect can be formed with anyone of the examples or features which will be described further below in connection with an integrated power module of the second aspect or a method for fabricating a semiconductor module of the third aspect according to the third aspect.

The present disclosure also relates to an integrated power module according to the second aspect. The integrated power module according to the second aspect comprises a carrier, at least one power transistor chip disposed on the carrier, at least one power diode chip disposed on the carrier, at least one driver chip disposed on the carrier, a plurality of external connectors, and an encapsulation layer covering the power transistor chip and the power diode chip, the encapsulation layer comprising electrical via connections for providing electrical connections between the driver chip and the external connectors.

According to an example of the integrated power module of the second aspect, the encapsulation layer comprises further electrical via connections for providing electrical connections between the at least one semiconductor driver chip and the at least one semiconductor transistor chip and between the at least one semiconductor transistor chip and the at least one semiconductor diode chip.

According to an example of the integrated power module of the second aspect, semiconductor transistor chips and semiconductor diode chips are interconnected to form an AC/AC converter circuit, an AC/DC converter circuit, a DC/AC converter circuit, a DC/DC converter circuit, or a frequency converter circuit.

Further examples of the integrated power module of the second aspect can be formed with anyone of the examples or features which were described above in connection with the semiconductor module of the first aspect.

Figure 5:
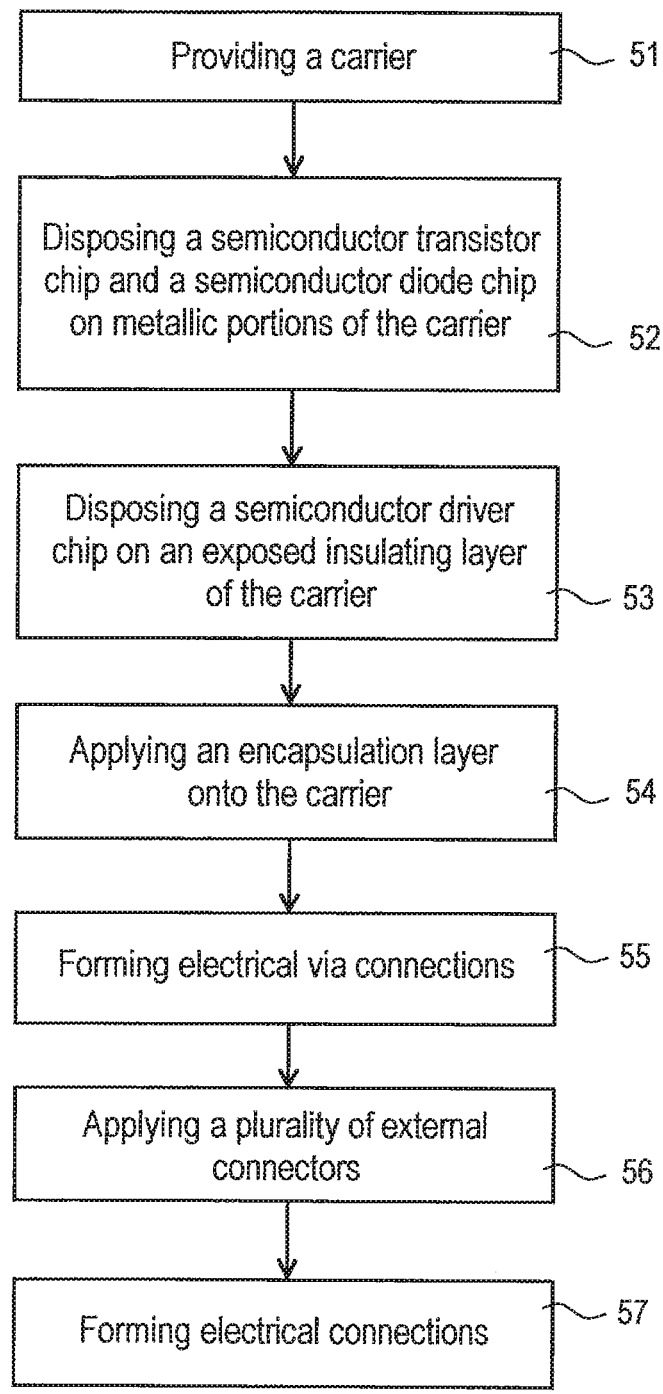
FIG. 5 shows a flow diagram for illustrating a method for fabricating a semiconductor module according to an example in which a carrier comprises an uppermost metallic layer comprising metallic portions and opening portions and in which the transistor chip and the diode chip are disposed on the metallic portions and the driver chip is disposed in an opening portion on an insulating layer underneath the metallic layer.

FIG. 5 shows a flow diagram for illustrating a method for fabricating a semiconductor module according to a third aspect. The method 50 of FIG. 5 comprises providing a carrier, the carrier comprising an uppermost metallic layer and an insulating layer underneath the metallic layer, the metallic layer comprising at least one metallic portion and at least one opening portion in which the insulating layer is exposed (51), disposing at least one semiconductor transistor chip and at least one semiconductor diode chip on metallic portions of the metallic layer (52), disposing at least one semiconductor driver chip on the insulating layer in an opening portion of the metallic layer (53), applying an encapsulation layer onto the carrier, the semiconductor transistor chip, the semiconductor diode chip, and the semiconductor driver chip (54), forming electrical via connections into the encapsulation layer (55), applying a plurality of external connectors (56), and forming electrical connections between the semiconductor driver chip and the external connectors, between the at least one semiconductor driver chip and the at least one semiconductor transistor chip, and between the at least one semiconductor transistor chip and the at least one semiconductor diode chip (57).

According to an example of the method of the third aspect, providing a carrier further comprises forming a plurality of foot points on the insulating layer in the at least one opening portion, and disposing the at least one semiconductor driver chip comprises electrically connecting each one of the foot points with one of a plurality of contact pads of the semiconductor driver chip.

According to an example of the method of the third aspect, forming electrical via connections into the encapsulation layer comprises forming at least a part of the electrical via connections such that each one of the electrical via connections extends from an upper main face of the encapsulation layer vertically down to one of the plurality of foot points.

Further examples of the method of the third aspect can be formed by combining with examples or features which were described above in connection with the semiconductor module of the first aspect or the integrated power module of the second aspect.

While the invention has been illustrated and described with respect to one or more implementations, alterations and/or modifications may be made to the illustrated examples without departing from the spirit and scope of the appended claims. In particular with regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

The invention claimed is:
1. An integrated power module, comprising:
a carrier;
at least one power transistor disposed on the carrier;
at least one power diode disposed on the carrier, wherein the at least one power transistor and the at least one power diode are disposed on a first metallic portion of the carrier;
at least one driver chip disposed on a second metallic portion of the carrier, wherein the at least one driver chip is connected to one or more metal lines on the carrier by one or more bond wires, wherein the one or more metal lines are separate from the first metallic portion and the second metallic portion, and wherein at least one of the one or more metal lines is connected to a metallic foot point on the carrier;
wherein the at least one power transistor, the at least one power diode and the at least one driver chip are arranged laterally side by side on the carrier;
a plurality of external connectors;
an encapsulation layer covering the at least one power transistor, the at least one power diode, the at least one driver chip, the one or more metal lines, the metallic foot point and the one or more bond wires, the encapsulation layer comprising electrical via connections that extend from the at least one power transistor to a top of the encapsulation layer and from the metallic foot point to the top of the encapsulation layer; and
a solder resist layer over the top of the encapsulation layer, the solder resist layer including additional electrical via connections that are electrically connected between the electrical via connections and the plurality of external connectors, wherein the plurality of external connectors are on an upper surface of the solder resist layer.

2. The power module according to claim 1, wherein the encapsulation layer comprises further electrical via connections for providing electrical connections between the at least one driver chip and the at least one power transistor and between the at least one power transistor and the at least one power diode.

3. The power module according to claim 2, wherein the at least one power transistor and the at least one power diode are interconnected to form an AC/AC converter circuit, an AC/DC converter circuit, a DC/AC converter circuit, a DC/DC converter circuit, or a frequency converter circuit.

4. The power module according to claim 1, where the at least one power transistor, the at least one power diode and the at least one driver chip are coplanar.

* * * * *